United States Patent
Du et al.

(10) Patent No.: US 12,308,326 B2
(45) Date of Patent: *May 20, 2025

(54) ELECTRONIC COMPONENT WITH LID TO MANAGE RADIATION FEEDBACK

(71) Applicant: Qorvo US, Inc., Greensboro, NC (US)

(72) Inventors: Zhunming Du, Plano, TX (US); Christopher Sanabria, Richardson, TX (US); Timothy M. Gittemeier, Plano, TX (US); Terry Hon, Saint Paul, TX (US); Anthony Chiu, Richardson, TX (US); Tariq Lodhi, Cupertino, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/592,693

(22) Filed: Mar. 1, 2024

(65) Prior Publication Data

US 2024/0250041 A1    Jul. 25, 2024

Related U.S. Application Data

(63) Continuation of application No. 17/557,551, filed on Dec. 21, 2021, now Pat. No. 11,948,893.

(51) Int. Cl.
*H01L 23/552* (2006.01)
*H01L 23/047* (2006.01)
*H01L 23/66* (2006.01)

(52) U.S. Cl.
CPC .......... *H01L 23/552* (2013.01); *H01L 23/047* (2013.01); *H01L 23/66* (2013.01); *H01L 2223/6683* (2013.01)

(58) Field of Classification Search
CPC ..... H01L 23/552; H01L 23/047; H01L 23/66; H01L 2223/6683
See application file for complete search history.

(56) References Cited

U.S. PATENT DOCUMENTS 5,832,598 A    11/1998   Greenman et al.
8,093,691 B1    1/2012   Fuentes et al.
(Continued)

FOREIGN PATENT DOCUMENTS

WO    2021085378 A1    5/2021

OTHER PUBLICATIONS

Dixon, P. et al., "Dampening cavity resonance using absorber material," RF Design, May 2004, https://www.laird.com/sites/default/files/2019-01/Dampening%20Cavity%20Resonance%20Using%20Absorber%20Material%20White%20Paper.pdf, pp. 16-19.
(Continued)

*Primary Examiner* — Peniel M Gumedzoe
(74) *Attorney, Agent, or Firm* — Withrow & Terranova, P.L.L.C.

(57) ABSTRACT

The disclosure is directed to an electronic device with a lid to manage radiation feedback. The electronic device includes a lid having at least one sidewall and a top wall, as well as a semiconductor positioned within a cavity of the lid. In certain embodiments, the lid includes at least one dielectric material and at least one internal conductive layer at least partially embedded within the at least one dielectric material. In certain embodiments, the lid includes dielectric material, as well as an internal wall extending from the top wall and positioned between an input port and an output port of the semiconductor. Such configurations may suppress any undesirable feedback through the lid between the input port and the output port of the semiconductor.

20 Claims, 11 Drawing Sheets

(56) References Cited

U.S. PATENT DOCUMENTS

| | | |
|---|---|---|
| 2002/0014684 A1 | 2/2002 | Douglas |
| 2007/0176272 A1 | 8/2007 | Saitoh et al. |
| 2007/0190858 A1* | 8/2007 | Stoneham ............ H05K 9/0031 439/607.01 |
| 2011/0127655 A1 | 6/2011 | Fujii |
| 2012/0025366 A1 | 2/2012 | Kanaya et al. |
| 2017/0229368 A1 | 8/2017 | Chiu et al. |
| 2017/0271221 A1 | 9/2017 | Bovaird et al. |
| 2017/0338194 A1 | 11/2017 | Gittemeier |
| 2019/0259676 A1 | 8/2019 | Dresser |
| 2023/0197629 A1 | 6/2023 | Du et al. |

OTHER PUBLICATIONS

Garner, B. et al., "Design Guidelines for Metallic Enclosures for RF Circuits," High Frequency Electronics, Jun. 2016, http://www.highfrequencyelectronics.com/index.php?option=com_content&view=article&id=1461:design-guidelines-for-metallic-enclosures-for-rf-circuits&catid=139:2016-06-june-articles&Itemid=189, 4 pages.

Yang, X.-L. et al., "Mitigation of unintentional radiation from the package lid using PMC packaging," 2017 Asia-Pacific International Symposium on Electromagnetic Compatibility (APEMC), Jun. 20-23, 2017, Seoul, South Korea, IEEE, pp. 238-240.

Non-Final Office Action for U.S. Appl. No. 17/557,551, mailed Aug. 15, 2023, 11 pages.

Notice of Allowance for U.S. Appl. No. 17/557,551, mailed Dec. 11, 2023, 8 pages.

Extended European Search Report for European Patent Application No. 22211991.9, mailed Jun. 2, 2023, 10 pages.

\* cited by examiner

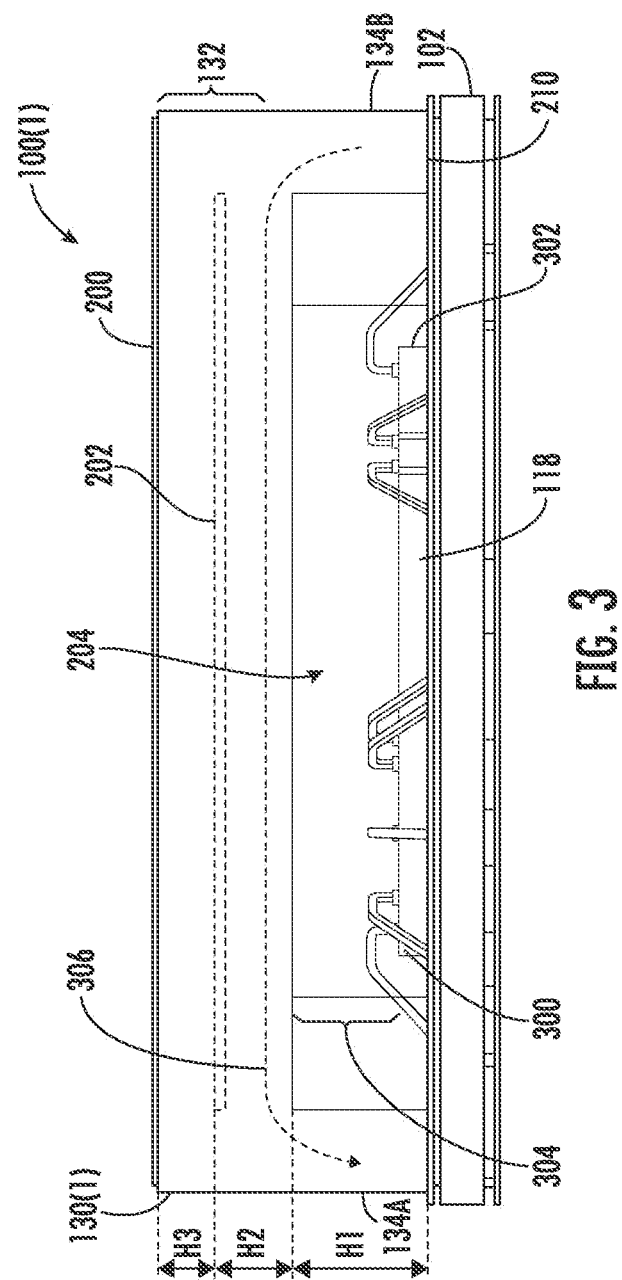

ELECTRONIC COMPONENT WITH LID TO MANAGE RADIATION FEEDBACK

RELATED APPLICATIONS

This application is a continuation of U.S. patent application Ser. No. 17/557,551, filed Dec. 21, 2021, now U.S. Pat. No. 11,948,893, the disclosure of which is hereby incorporated herein by reference in its entirety.

FIELD OF THE DISCLOSURE

The present invention relates to the packaging of integrated circuits (ICs). In particular, the present invention relates to an electronic device with a lid to manage radiation feedback.

BACKGROUND

Wireless communication demands often require higher operating frequencies, increased operating power, wider operating and video bandwidths, and/or higher order modulation schemes, etc. A power amplifier is a significant integrated circuit (IC) in these systems. The simultaneous need for more bandwidth, output power, and linearity of the power amplifier are competing requirements. In addition, packaging plays a crucial role in the power amplifier meeting these requirements. For example, performance may be affected by various assembly related variables, such as wirebond length, off-chip component placement, and/or signal/port interface locations relative to an IC.

SUMMARY

Embodiments of the disclosure are directed to an electronic device with a lid to manage radiation feedback. The electronic device includes a lid having at least one sidewall and a top wall, as well as a semiconductor positioned within a cavity of the lid. In certain embodiments, the lid includes at least one dielectric material and at least one internal conductive layer at least partially embedded within the at least one dielectric material. In certain embodiments, the lid includes dielectric material as well as an internal wall extending from the top wall and positioned between an input port and an output port of the semiconductor. Such configurations may suppress any undesirable feedback through the lid between the input port and output port of the semiconductor.

One embodiment of the disclosure relates to an electronic package including a lid defining a cavity. The lid includes at least one sidewall and a top wall including at least one dielectric material and at least one internal conductive layer at least partially embedded within the at least one dielectric material, the at least one dielectric material comprising epoxy. The electronic package further includes a semiconductor positioned within the cavity of the lid.

Another embodiment of the disclosure relates to an electronic package including a lid defining a cavity. The lid includes at least one sidewall, a top wall comprising at least one dielectric material, and an internal wall extending from the top wall. The internal wall includes at least one dielectric material. The electronic package includes at least one semiconductor positioned within the cavity of the lid. The at least one semiconductor includes at least one input port and at least one output port. The internal wall is positioned between the at least one input port and the at least one output port.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

FIG. 3 is a side view of an electronic package with the lid of FIGS. 2A-2D;

DETAILED DESCRIPTION

Figure 1A:
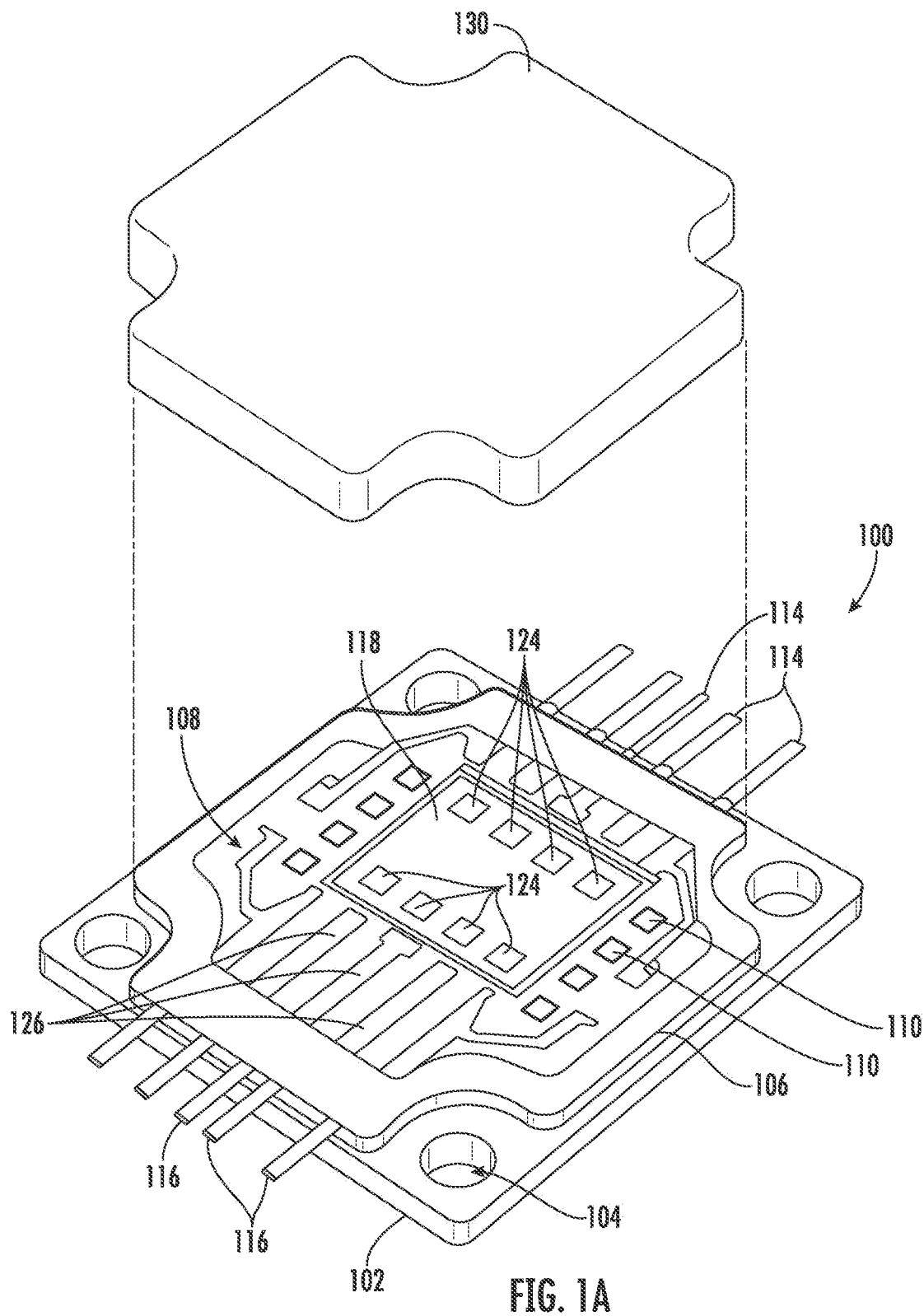
FIG. 1A is a top perspective exploded view of an electronic package (e.g., semiconductor package)

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element, and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Embodiments of the disclosure are directed to an electronic device with a lid to manage radiation feedback. The electronic device includes a lid having at least one sidewall and a top wall, as well as a semiconductor positioned within a cavity of the lid. In certain embodiments, the lid includes at least one dielectric material and at least one internal conductive layer at least partially embedded within the at least one dielectric material. In certain embodiments, the lid includes dielectric material, as well as an internal wall extending from the top wall and positioned between an input port and an output port of the semiconductor. Such configurations may suppress any undesirable feedback through the lid between the input port and output port of the semiconductor.

Figure 1B:
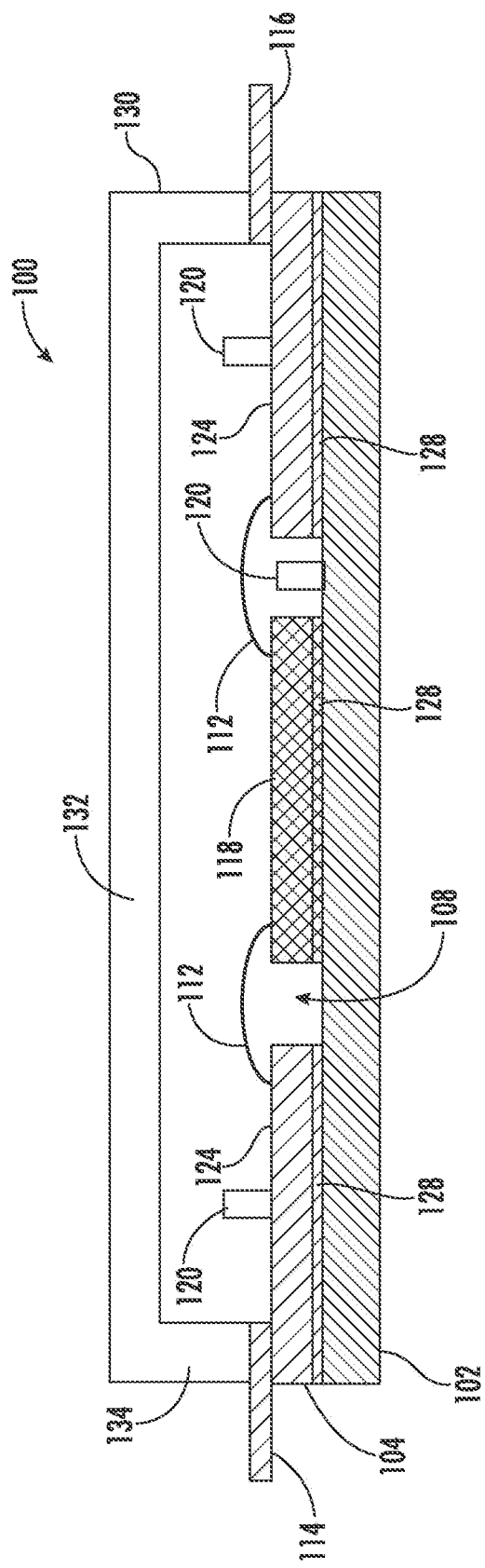
FIG. 1B is a cross-sectional side view of the electronic package of FIG. 1A.

Before delving into specific details of various aspects of the present disclosure, an overview of various elements that may be included in exemplary electronic packages of the present disclosure is provided. In particular, FIGS. 1A and 1B are views of an electronic package 100 (which may also be referred to as a semiconductor package 100).

The electronic package 100 may include a carrier 102 (which may also be referred to as a base). In certain embodiments, the carrier 102 may be sufficiently rigid so as to prevent undesired flexing of any components coupled thereto. Additionally, the carrier 102 may include a plurality of holes 104 suitable for receiving a fastening means, such as screws or pins. The holes 104 may allow the electronic package 100 to be affixed to a host device or system, such as a radio frequency (RF) system. The carrier 102 may be formed from electrically conductive materials, thermally conductive materials, or non-conductive materials. In certain embodiments, the carrier 102 may include metal, metal alloy, ceramic, diamond, copper, tungsten, tungsten-copper (W—Cu), and/or copper-molybdenum-copper (Cu—Mo—Cu). In other embodiments, the carrier 102 may be plated, such as with a conductive material (e.g., gold).

The electronic package 100 may include a ring structure 106 (which may also be referred to as a signal carrying component, ring frame, etc.), which may be a printed circuit board (PCB), laminate, substrate, printed wiring board, flexible circuit, dielectric (e.g., soft dielectric), and/or another similar component comprising conductive pathways. The ring structure 106 may be coupled to the carrier 102, such as by an adhesive material (e.g., epoxy), soldering, pressure bonding, and/or temperature bonding. In certain embodiments, an adhesive material used to attach the ring structure 106 to the carrier 102 may be conductive, such as a conductive epoxy preform.

The ring structure 106 has an opening 108 therethrough. In certain embodiments, the ring structure 106 may have a plurality of outer pads 110, which may be made of a conductive material (e.g., copper). The outer pads 110 may be adapted to have one or more components (e.g., active and/or passive components) and/or leads attached thereto (e.g., via soldering). Interconnects 112 may be attached to the outer pads 110 of the ring structure 106, such as through conventional ribbon or wire bonding techniques.

In some embodiments, the ring structure 106 of the electronic package 100 may be coupled to one or more leads 114, 116 that carry a signal through the electronic package 100. The electronic package 100 may include input-side leads 114 located at a first side (e.g., input side) of the electronic package 100 (e.g., to receive RF input signals). Output-side leads 116 are leads located at a second side (e.g., output side) of the electronic package 100, on which the electronic package 100 may provide output signals to an external circuitry/system. Each of the input-side leads 114 and/or output-side leads 116 may be formed of a metal or metal alloy, such as copper. The plurality of leads 114, 116 may be tuned, positioned, and/or of different sizes to perform different signal carrying and/or routing functions.

The electronic package 100 may include one or more dies 118 and/or one or more electronic components 120 attached to the carrier 102 and disposed in the opening 108 of the ring structure 106, such that the ring structure 106 surrounds the at least one die 118 and/or the electronic components 120. The die 118 and/or the electronic components 120 may be mechanically coupled to the carrier 102 via solder 128 (e.g., gold-tin or other alloys) and/or another die attach.

The ring structure 106 may be electrically coupled to the die 118 through the interconnects 112. The die 118 may have a functional circuit fabricated thereon. The die 118 may include gallium arsenide (GaAs), gallium nitride (GaN), etc. The die 118 may be attached using any suitable material, such as gold-tin (AuSn) or another alloy. In certain embodiments, the die 118 includes die pads 124 on a top surface of the die 118, each of which is connected to a corresponding connecting trace 126 via an interconnect 112, such as a wire or a ribbon bond. The connecting traces 126 and the die pads 124 may be formed of any suitably conductive material, such as copper.

The one or more electronic components 120 may be attached directly to the carrier 102 and/or attached to the ring structure 106. The one or more electronic components 120 may include active components (e.g., transistors, diodes, and the like) and/or passive components (e.g., resistors, capacitors, inductors, transformers, and the like). The one or more of the electronic components 120 may be electrically coupled to the ring structure 106 via one or more of the interconnects 112.

A lid 130 may have a top wall 132 and a plurality of sidewalls 134 attached to the ring structure 106. Thus, the carrier 102, the ring structure 106, the input-side leads 114, the output-side leads 116, and the lid 130 may enclose the die 118 and the electronic components 120 in the electronic package 100. The lid 130 may be formed from plastic, a plastic composite material, metal, metal alloy, and/or ceramic, etc. The lid 130 may be coupled to a top surface of the ring structure 106 (e.g., a surface opposite the surface of the ring structure 106 that is coupled to the carrier 102), such as by an adhesive material (e.g., epoxy, resin, acrylic, and/or silicone). The lid 130 may be coupled directly to the carrier 102 in some embodiments. In certain embodiments, the adhesive material used to attach the lid 130 to the ring structure 106 or to the carrier 102 may be non-conductive. As part of the enclosure provided by the electronic package 100, a seal ring may be formed, for example, to protect elements (e.g., a die, active components, and/or passive components) sealed in by the combination of the carrier 102, the ring structure 106, and the lid 130.

FIGS. 2A-2D are views of a lid 130(1) with an external top conductive layer 200 and an internal conductive layer 202. In particular, the lid 130(1) forms an air cavity 204 to house the die 118 (e.g., semiconductor). Although the lid 130(1) is generally of a rectangular shape, the lid 130(1) may be any of a variety of shapes and/or sizes. Use of air-cavity packages in a transceiver enables higher levels of integration and lower cost assembly methods, such as compared to chip-and-wire microwave module assemblies. As operation frequency increases, package lid effects can introduce cavity-related isolation issues that can lead to performance degradation and/or oscillation issues. The lid 130(1) in this and other embodiments discussed herein may not be grounded.

The external top conductive layer 200 is at a top surface 203 of the lid 130(1). The external top conductive layer 200 may be any of a variety of sizes and/or shapes. For example, the external top conductive layer 200 may be thicker or thinner. The external top conductive layer 200 may cover only a portion of the top surface 203 of the lid 130(1).

The top wall 132 includes an upper dielectric layer 206 and a lower dielectric layer 208 with the internal conductive layer 202 positioned therebetween. The internal conductive layer 202 is embedded within the dielectric layers 206, 208 such that the internal conductive layer 202 is surrounded by dielectric material (e.g., fiber glass). The width of the internal conductive layer 202 is less than the width and/or length of the lid 130(1). In certain embodiments, the lid 130(1) may include additional internal conductive layers 202. Further, the internal conductive layer 202 may be any size and/or shape. For example, the internal conductive layer 202 may be smaller than the external top conductive layer 200.

The lid 130(1) includes left sidewall 134A, right sidewall 134B, front sidewall 134F, and rear sidewall 134R (referred to generally as sidewalls 134). In certain embodiments, the sidewalls 134 comprise dielectric material and are devoid of internal conductive layers 202. In particular, a bottom surface 210 of the sidewalls 134 is a dielectric material and is devoid of a conductive material. This facilitates application of the lid 130(1) to the carrier 102.

In certain embodiments, the dielectric material of the top wall 132 and/or sidewalls 134 includes an epoxy. The conductive material of the external top conductive layer 200 and/or the internal conductive layer 202 includes metal.

FIG. 3 is a side view of an electronic package 100(1) (i.e., electronic component) with the lid 130(1) of FIGS. 2A-2D. In particular, the electronic package 100(1) (e.g., transceiver, monolithic microwave integrated circuit (MMIC), etc.) includes a carrier 102, a lid 130(1) attached to the carrier 102, and a die 118 (e.g., semiconductor) housed in an air cavity 204 of the lid 130(1). An air gap 304 is formed between the die 118 and a top wall 132 of the lid 130(1). The die 118 includes an input end 300 and an output end 302. The lid 130(1) may inadvertently form a feedback signal path 306 from the output end 302 of the die 118 to the input end 300 of the die 118. This feedback may distort or negatively affect performance of the die 118. Use of an external top conductive layer 200 and/or an internal conductive layer 202 is configured to suppress the feedback signal through the feedback signal path 306 to improve performance of the die 118. In particular, the external top conductive layer 200 and/or the internal conductive layer 202 are not electrically grounded. As shown, in certain embodiments, the external top conductive layer 200 and/or the internal conductive layer 202 extend between an input end 300 of the die 118 to an output end 302 of the die 118.

A user can intentionally tune the frequency response of the electronic package 100(1) by adding conductive layers 200, 202 and/or dielectric layers 206, 208 to the lid 130(1). Doing so can reduce undesirable resonance and feedback in the air cavity 204 and through the lid 130(1). Feedback signal suppression performance may be tuned by adjusting the location, size, and/or shape of the external top conductive layer 200, the internal conductive layer 202, and/or the air cavity 204. For example, the width, length, and/or thickness of the internal conductive layer 202 may be altered. Further, a height H1 of the air cavity 204, a height H2 of the internal conductive layer 202 to the air cavity 204, and/or a height H3 of the internal conductive layer 202 from the top surface 203 may be altered. In certain embodiments, the internal conductive layer 202 may be exposed to the air cavity 204 such that only a portion of the internal conductive layer 202 is sandwiched between the dielectric layers 206, 208. In this way, the feedback signal is altered as it propagates through the feedback signal path 306 through the top wall 132 of the lid 130(1). Such a configuration is compatible with high volume air cavity package manufacturing processes.

Figure 2A:
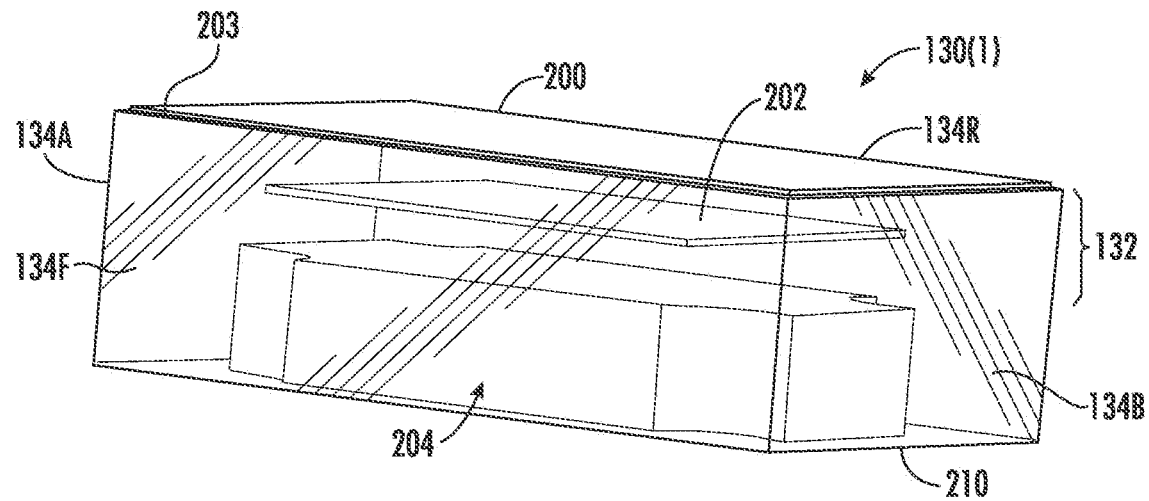
FIG. 2A is an assembled perspective view of a lid with a top conductive layer and an internal conductive layer.
Figure 2B:
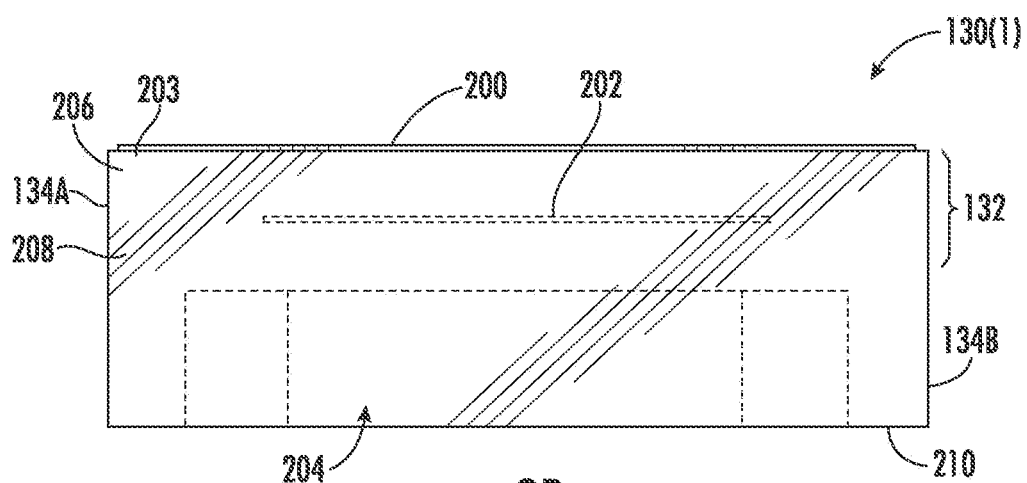
FIG. 2B is a cross-sectional sideview of FIG. 2A.
Figure 2C:
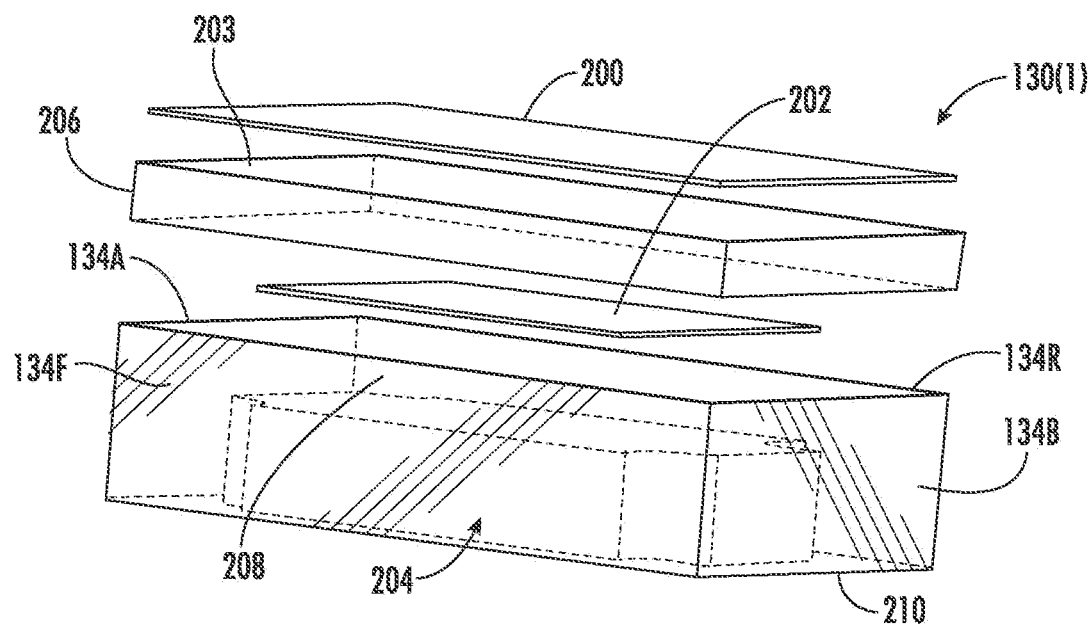
FIG. 2C is an exploded perspective view of the lid of FIG. 2A.
Figure 2D:
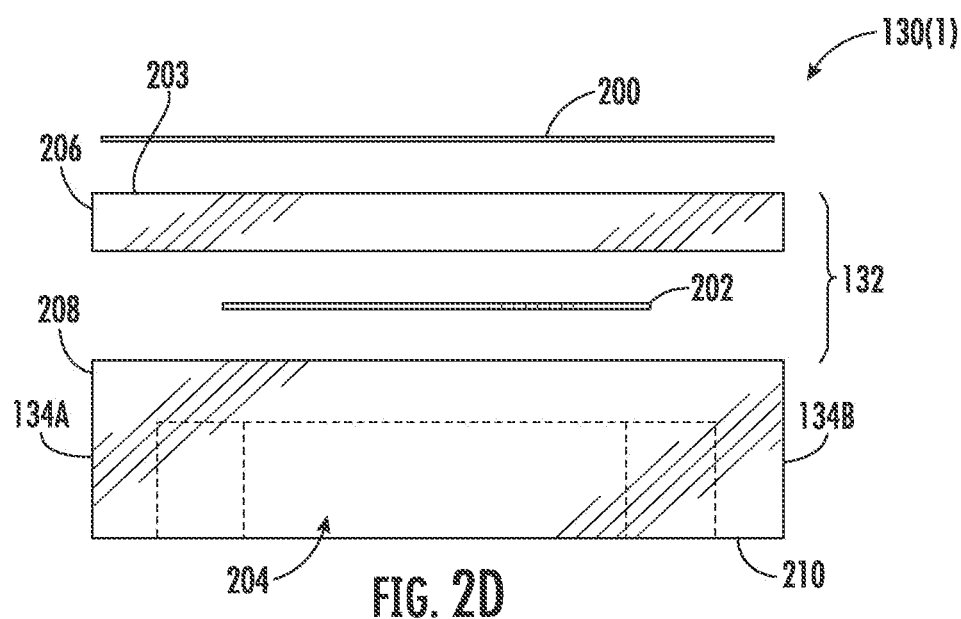
FIG. 2D is an exploded cross-sectional sideview of the lid of FIG. 2B.
Figure 4:
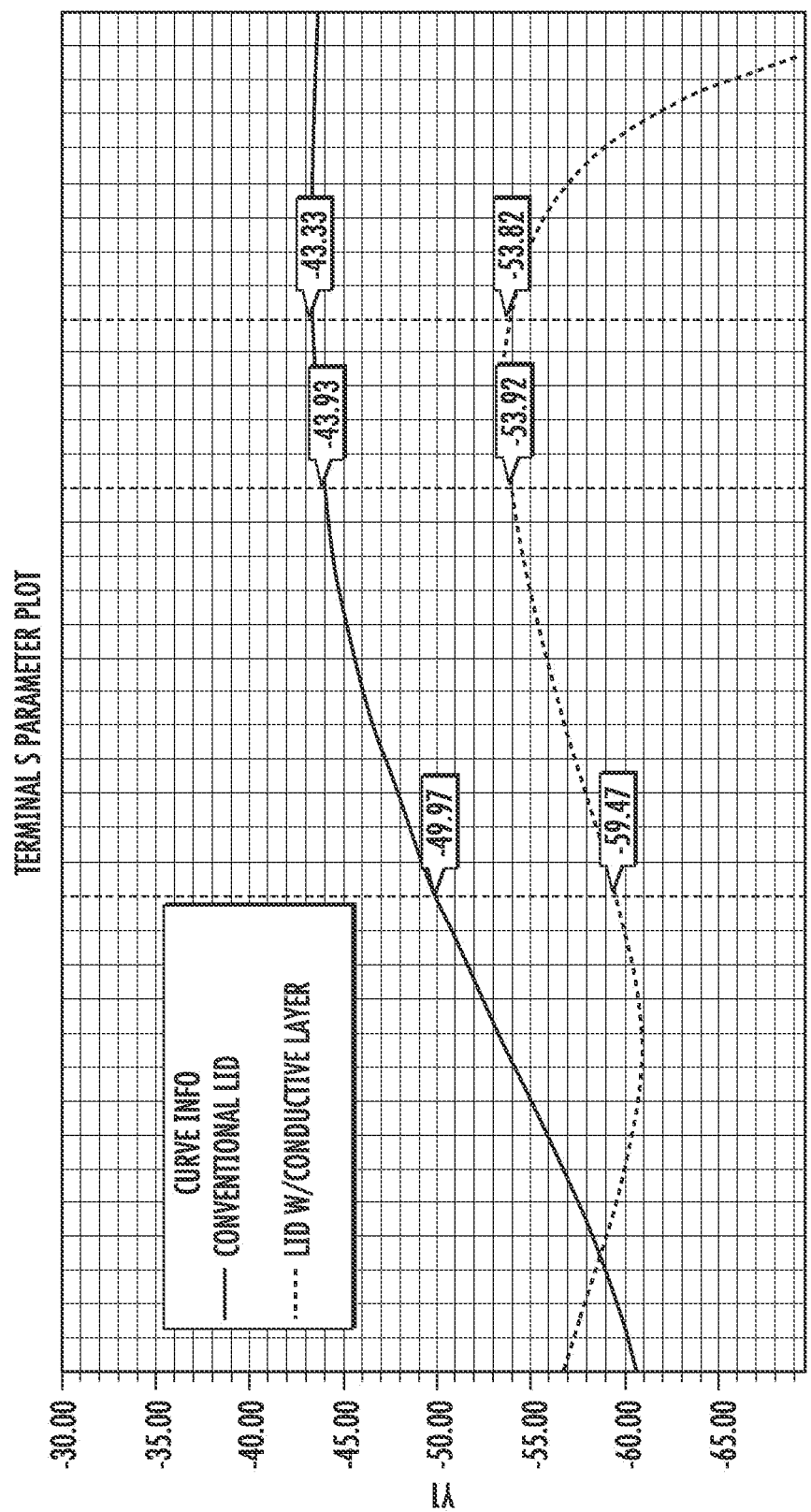
FIG. 4 is a chart illustrating an improvement in feedback signal suppression of the lid of FIGS. 2A-3.

FIG. 4 is a chart illustrating an improvement in feedback signal suppression of the lid 130(1) of FIGS. 2A-3. As illustrated, the lid 130(1) with the internal conductive layer 202 improved suppression of the feedback signal and, thereby, improved performance of the electronic package 100(1). For example, in certain embodiments, the lid 130(1) suppresses the feedback signal level by 10 dB at 40.5 GHz compared to a conventional lid.

Figure 5:
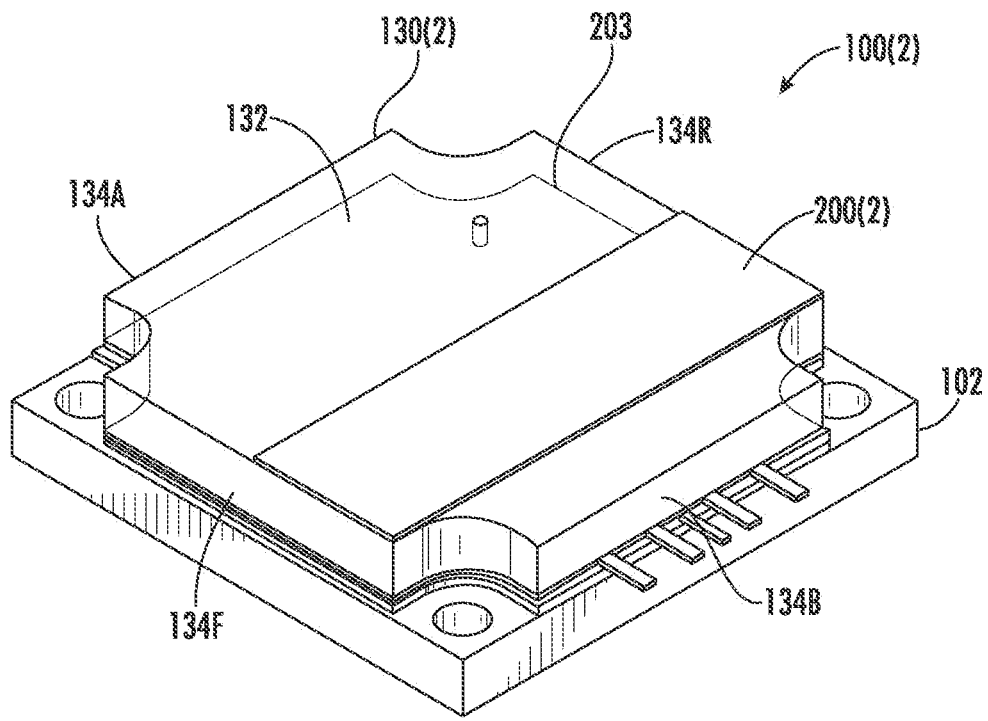
FIG. 5 is a perspective view of a lid with a top conductive layer over only a portion of a top wall of the lid.

FIG. 5 is a perspective view of a lid 130(2) of an electronic package 100(2) with an external top conductive layer 200(2) over only a portion of a top wall 132 of the lid 130(2). As illustrated, the external top conductive layer 200(2) only covers a portion of a top surface 203 of the top wall 132. In certain embodiments, the external top conductive layer 200(2) and/or an internal conductive layer 202 are positioned over an output end 302 of a die 118. In certain embodiments, the external top conductive layer 200(2) covers only about 50% of the top surface 203 of the lid 130(2). In certain embodiments, the external top conductive layer 200(2) covers less than 50% of the top surface 203 of the lid 130(2).

Figure 6:
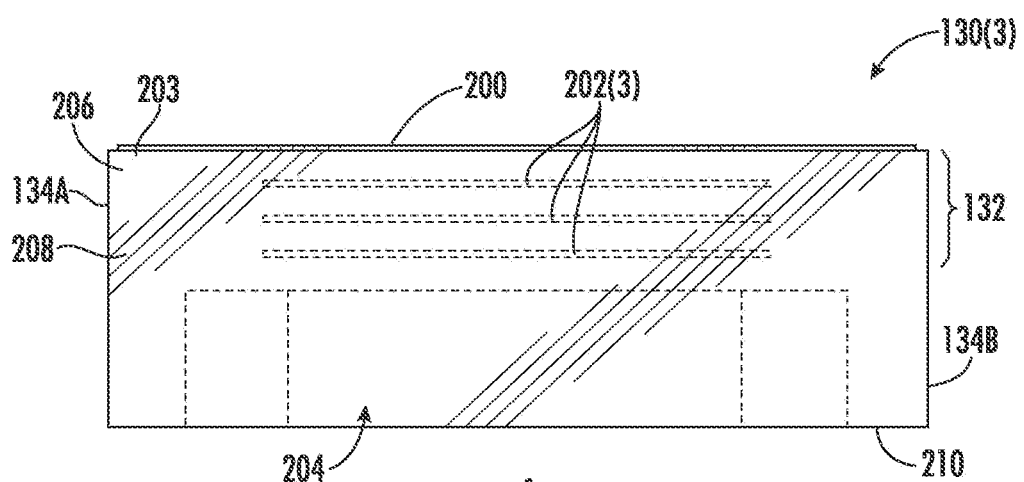
FIG. 6 is a side view of a lid with multiple internal conductive layers.

FIG. 6 is a side view of a lid 130(3) with multiple internal conductive layers 202(3). In particular, the plurality of internal conductive layers 202(3) are separated from each other by dielectric material of a top wall 132 of the lid 130(3). Any number of conductive layers 202(3) may be used.

Figure 7A:
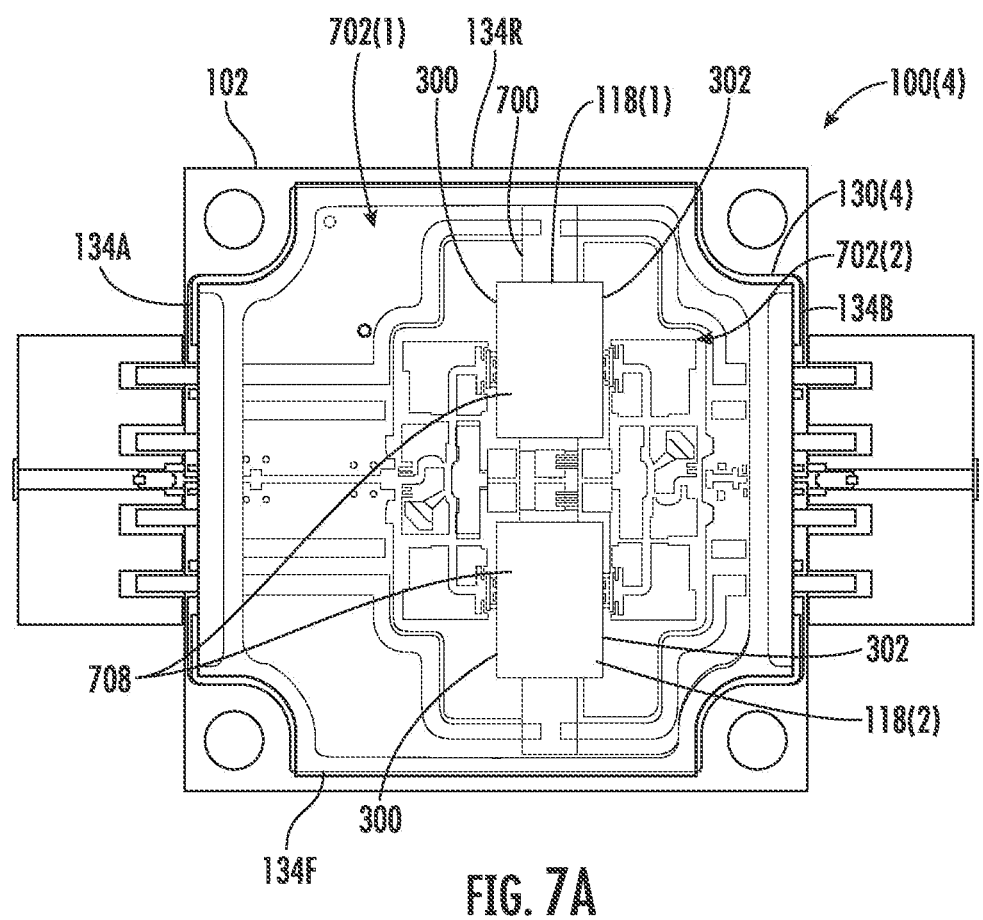
FIG. 7A is a top view of an electronic package with a lid with an internal wall extending between an input port and an output port of a semiconductor die in the lid.
Figure 7B:
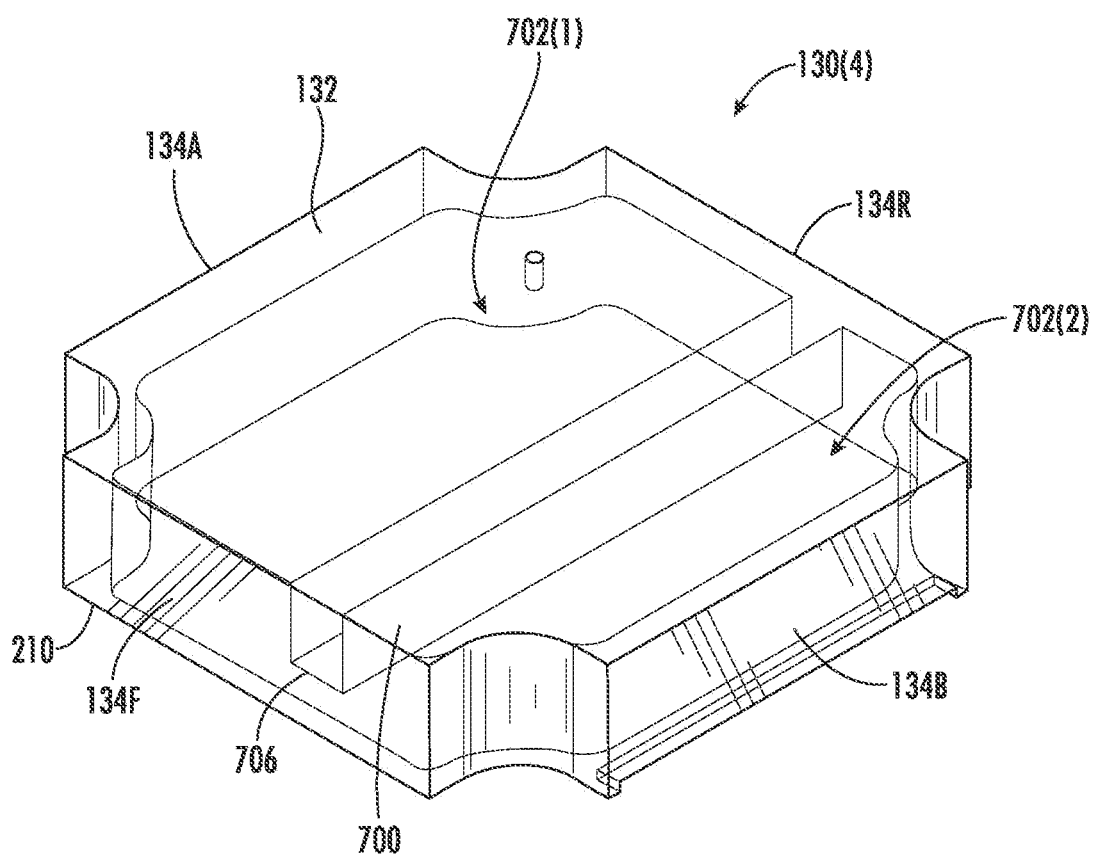
FIG. 7B is a perspective view of the lid of FIG. 7A.

FIGS. 7A and 7B are views of an electronic package 100(4) with a lid 130(4) with an internal wall 700 extending between an input end 300 and an output end 302 of a semiconductor die 118 in the lid 130(4). The electronic package 100(4) includes two dies 118(1), 118(2), each with an input end 300 and an output end 302. It is noted that the input ends 300 of the dies 118(1), 118(2) are in line and adjacent to one another, and the output ends 302 of the dies 118(1), 118(2) are also in line and adjacent to each other. Of course, fewer or more dies 118(1), 118(2) may be used.

The lid 130(4) includes a top wall 132 and sidewalls 134 extending downwardly from a periphery of the top wall 132. The lid 130(4) further includes the downwardly extending internal wall 700. The internal wall 700 extends between a front sidewall 134(3) and a rear sidewall 134(4). Accordingly, the internal wall 700 separates an air cavity 204 into a first portion 702(1) proximate the left sidewall 134A and a second portion 702(2) proximate the right sidewall 134B. Further, the internal wall 700 may be offset from a center of the lid 130(4). In particular, the internal wall 700 is configured to be positioned between the input ends 300 of the dies 118(1), 118(2) and the output ends 302 of the dies 118(1), 118(2).

As similarly noted above, use of air-cavity packages in a transceiver enables higher levels of integration and lower cost assembly methods, such as compared to chip-and-wire microwave module assemblies. As operation frequency increases, package lid effects can introduce cavity-related isolation issues that can lead to performance degradation and/or oscillation issues. The internal wall 700 of the lid 130(4) reduces feedback through the lid, thereby improving frequency response and stability.

In certain embodiments, the lid has a height of 2 mm to 6 mm, or a height of at least 4 mm. In certain embodiments, a clearance is provided between a bottom 706 of the internal wall 700 and a top 708 of the dies 118(1), 118(2). In certain embodiments, the clearance is between 0.5 mm and 1.5 mm (e.g., 0.9 mm). In certain embodiments, use of the internal wall 700 improves isolation in band by 7 dB.

Figure 8A:
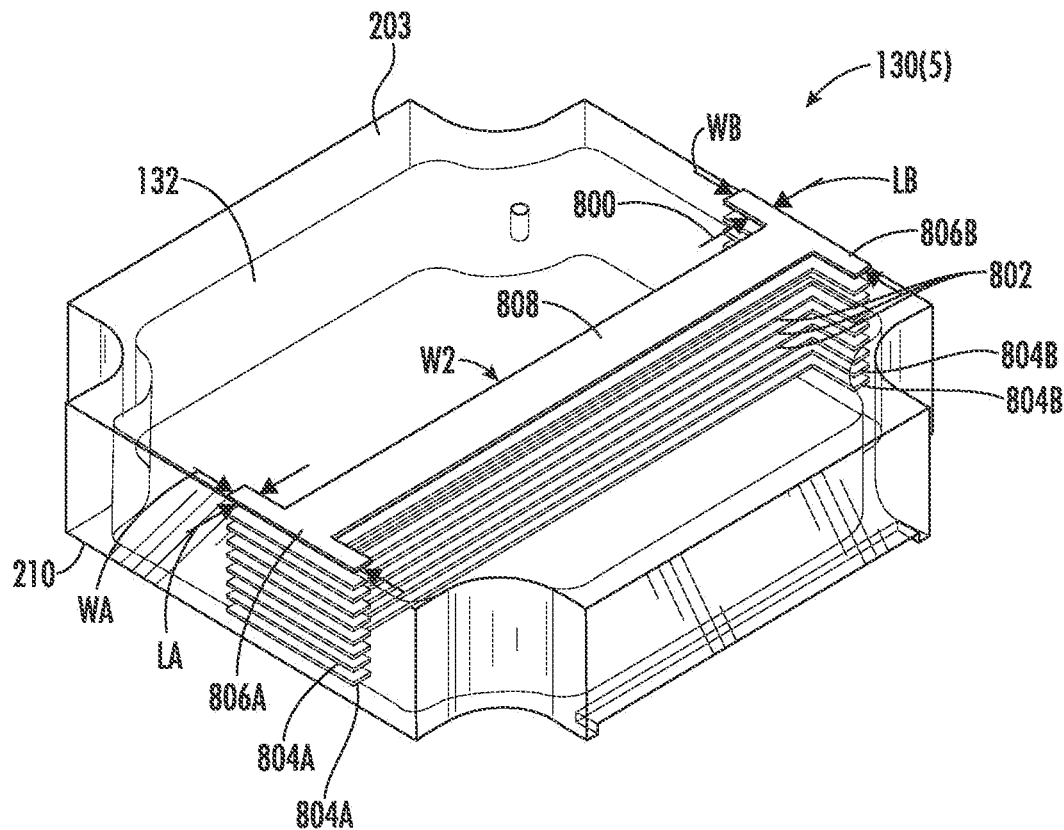
FIG. 8A is a perspective view of a lid with conductive layers embedded within the internal wall.
Figure 8B:
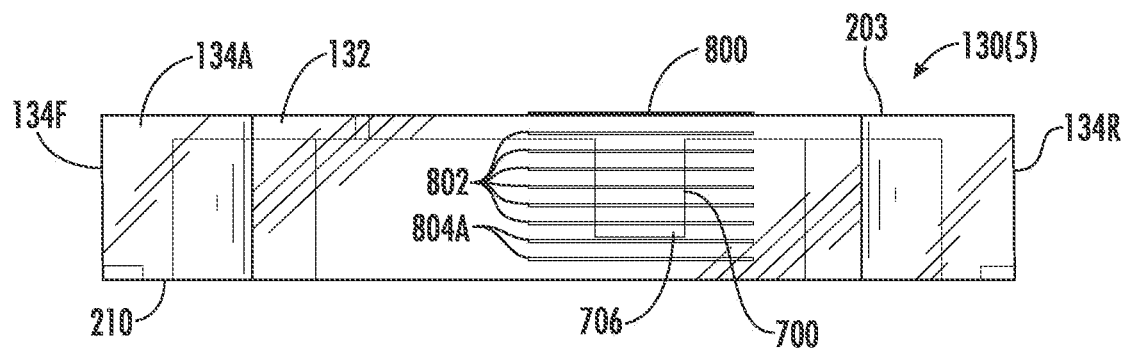
FIG. 8B is a side view of the lid of FIG. 8A.

FIGS. 8A and 8B are views of a lid 130(5) with conductive layers embedded within the internal wall 700. In particular, the lid 130(5) includes an external top conductive layer 800 and internal conductive layers 802. As similarly noted above, the top wall 132, sidewalls 134, and/or the internal wall 700 include a dielectric material (e.g., fiberglass). The external top conductive layer 800 is at a top surface 203 of the lid 130(5). The external top conductive layer 800 may be any of a variety of sizes and/or shapes. For example, the external top conductive layer 800 may be thicker or thinner. The external top conductive layer 800 may cover only a portion of the top surface 203 of the lid 130(5).

The internal conductive layers 802 are embedded within the internal wall 700 and/or the sidewalls 134 such that the internal conductive layers 802 are surrounded by dielectric material (e.g., fiber glass). The internal conductive layers 802 may be any size and/or shape. Further, internal sidewall conductive layers 804A, 804B are embedded within the sidewalls 134. In certain embodiments, the internal conductive layers 802 within the internal wall 700 are positioned between the external top layer 800 and the internal sidewall conductive layers 804A, 804B. In this way, the internal sidewall conductive layers 804A, 804B are positioned proximate a bottom 706 of the internal wall 700 of the lid 130(5).

Each of the external top conductive layer 800 and/or the plurality of internal conductive layers 802, 804A, 804B are not electrically grounded and/or separated from each other by dielectric material of the top wall 132 and/or sidewalls 134 of the lid 130(5). Use of the conductive layers 800, 802, 804A, 804B is to modify and guide a feedback signal through the lid 130(5).

In certain embodiments, each of the external top conductive layer 800 and/or internal conductive layers 802 include a left wide sidewall portion 806A, a right wide sidewall portion 806B, and a narrow portion 808 (which may also be referred to as a narrow internal wall portion) extending therebetween. In this way, the left wide sidewall portion 806A and the right wide sidewall portion 806B have a width WA, WB, and the narrow portion 808 has a width W2, where WA, WB are greater than W2. Further, the left wide sidewall portion 806A and the right wide sidewall portion 806B have a length LA, LB.

The internal sidewall conductive layers 804A, 804B are embedded within sidewalls 134A, 134B. In particular, a first internal sidewall conductive layer 804A is separated from a second internal sidewall conductive layer 804B. The internal sidewall conductive layers 804A, 804B may be used to direct the feedback signal downward to the bottom 706 and the periphery of the lid 130(5).

As similarly discussed above, feedback signal suppression performance may be tuned by adjusting the location, size, and/or shape of the external top conductive layer 800 and the internal conductive layers 802, 804A, 804B. Of course, more or fewer layers 802, 804A, 804B may be used. In certain embodiments, isolation is improved by 10 dB or more.

Figure 9:
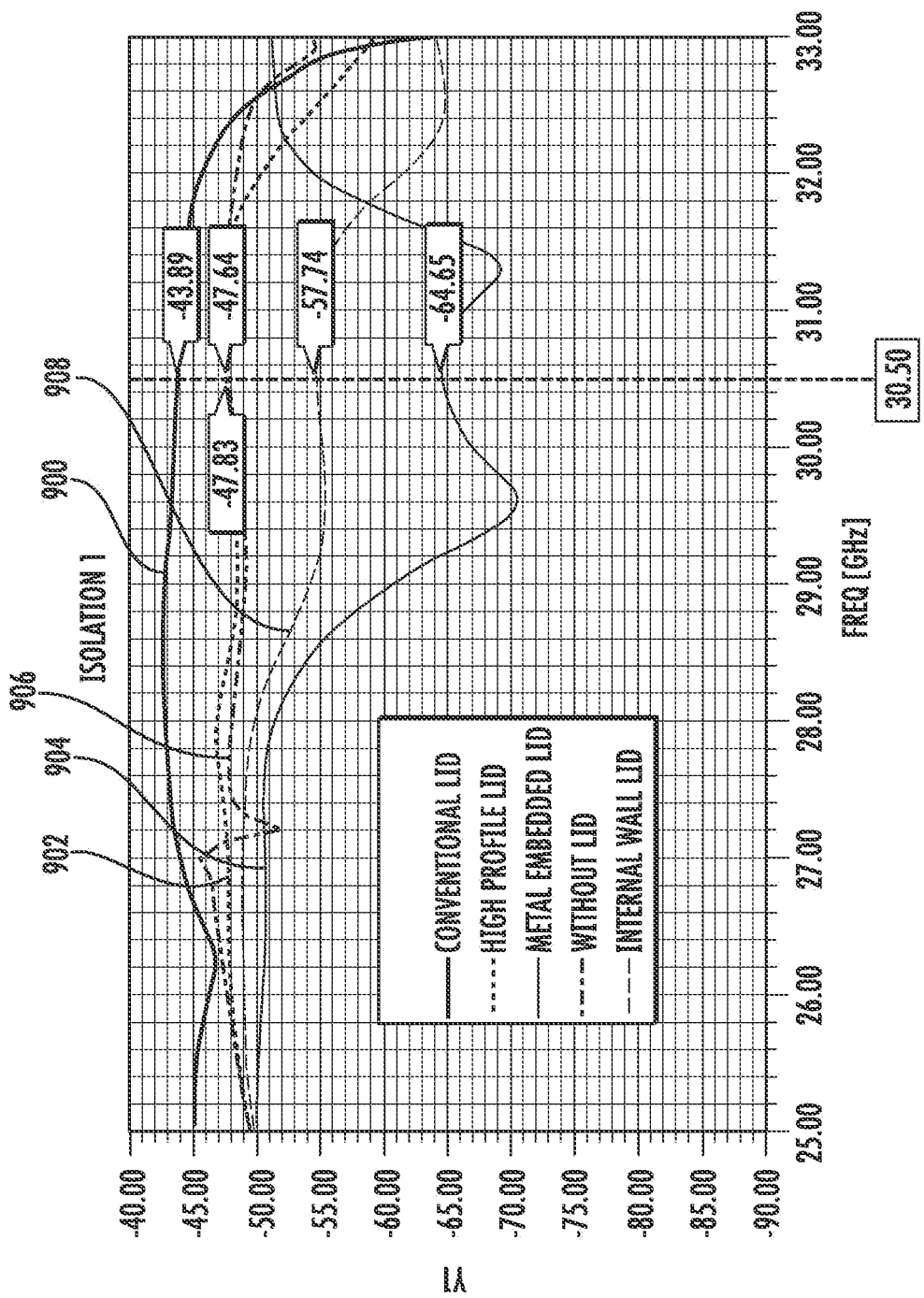
FIG. 9 is a chart comparing the performance of various lids in suppressing feedback signals.

FIG. 9 is a chart comparing the performance of various lids in suppressing feedback signals. In particular, illustrated is the performance of a conventional lid 900, with a high profile lid 902, with a metal embedded lid 904, with an electronic package without a lid 906, and with an internal wall lid 908. As illustrated, the metal embedded lid 904 performed best within the frequency range of interest, followed by the internal wall lid 908.

Those skilled in the art will recognize improvements and modifications to the preferred embodiments of the present disclosure. All such improvements and modifications are considered within the scope of the concepts disclosed herein and the claims that follow.

What is claimed is:

1. An electronic package, comprising:
 a lid defining a cavity, the lid comprising:
  a ring structure;
  a top wall comprising at least one dielectric material and at least one internal conductive layer at least partially embedded within the at least one dielectric material, the at least one dielectric material comprising epoxy;
 a semiconductor positioned within the cavity of the lid; and
 wherein the at least one internal conductive layer extends between an input end of the semiconductor to an output end of the semiconductor.

2. The electronic package of claim 1, wherein the electronic package comprises a transceiver.

3. The electronic package of claim 1, wherein the electronic package comprises a monolithic microwave integrated circuit (MMIC).

4. The electronic package of claim 1, wherein the lid forms an air gap between the top wall and the semiconductor.

5. The electronic package of claim 1, wherein the at least one internal conductive layer comprises a metal material.

6. The electronic package of claim 1, wherein the at least one internal conductive layer is not electrically grounded.

7. The electronic package of claim 1, wherein the at least one internal conductive layer comprises a plurality of internal conductive layers.

8. The electronic package of claim 7, wherein the plurality of internal conductive layers are separated from each other by the at least one dielectric material of the top wall of the lid.

9. The electronic package of claim 1, wherein the ring structure has a plurality of outer pads.

10. The electronic package of claim 9, wherein the plurality of outer pads are attached to interconnects.

11. The electronic package of claim 10, wherein the interconnects are attached to the plurality of outer pads through conventional ribbon or wire bonding techniques.

12. The electronic package of claim 1, further comprising one or more leads that are coupled to the ring structure and carry signals through the electronic package.

13. The electronic package of claim 1, further comprising at least one external conductive layer over at least a portion of the top wall of the lid.

14. An electronic package, comprising:
a lid defining a cavity, the lid comprising:
  a ring structure;
  a top wall comprising at least one dielectric material;
  an internal wall extending from the top wall, the internal wall comprising at least one dielectric material;
at least one semiconductor positioned within the cavity of the lid, the at least one semiconductor comprising at least one input port and at least one output port; and
wherein the internal wall is positioned between the at least one input port and the at least one output port.

15. The electronic package of claim 14, wherein at least one internal conductive layer comprises a plurality of internal conductive layers.

16. The electronic package of claim 15, wherein the plurality of internal conductive layers are separated from each other by the at least one dielectric material of the top wall of the lid.

17. The electronic package of claim 14, wherein the ring structure has a plurality of outer pads.

18. The electronic package of claim 17, wherein the plurality of outer pads are attached to interconnects.

19. The electronic package of claim 18, wherein the interconnects are attached to the plurality of outer pads through conventional ribbon or wire bonding techniques.

20. The electronic package of claim 15, further comprising one or more leads that are coupled to the ring structure and carry signals through the electronic package.

* * * * *